United States Patent [19]
Ihara

[11] Patent Number: 5,910,657
[45] Date of Patent: Jun. 8, 1999

[54] ELECTRON BEAM EXPOSURE APPARATUS FOR SCANNING ELECTRON MICROSCOPY

[75] Inventor: Toshiyuki Ihara, Nerima-ku, Japan

[73] Assignee: Adavantest Corporation, Tokyo, Japan

[21] Appl. No.: 08/856,581

[22] Filed: May 15, 1997

[30] Foreign Application Priority Data

May 15, 1996 [JP] Japan .................................. 8-120443

[51] Int. Cl.⁶ .................................................. H01J 37/26
[52] U.S. Cl. ........................................ 250/310; 250/397
[58] Field of Search .................................. 250/306, 310, 250/397

[56] References Cited

U.S. PATENT DOCUMENTS 3,854,071  12/1974  Heritage et al. ...................... 250/492.2
4,752,686  6/1988  Brust ...................................... 250/310
4,807,159  2/1989  Komatsu et al. ...................... 250/311
5,659,174  8/1997  Kaneoka et al. ...................... 250/310

*Primary Examiner*—Bruce Anderson
*Attorney, Agent, or Firm*—Kanesaka & Takeuchi

[57] ABSTRACT

An electron beam exposure apparatus for scanning electron microscopy, which includes a main control unit; an electron gun for emitting an electron beam; a deflection amplifier connected to the main control unit for outputting a drive signal for controlling deflection conditions of the electron beam; a secondary electron detector; an A/D converter selectively connected either the deflection amplifier or the secondary electron detector for generating a digital signal; an image memory connected to the A/D converter and selectively to the main control unit such that the main control checks outputs of the deflection amplifier in response to outputs of the image memory.

2 Claims, 4 Drawing Sheets

ELECTRON BEAM EXPOSURE APPARATUS FOR SCANNING ELECTRON MICROSCOPY

BACKGROUND OF THE INVENTION

1. Field of the Invention

The present invention relates generally to electron beam exposure apparatus and, more particularly, to an electron beam exposure apparatus for scanning electron microscopy (SEM).

2. Description of the Related Art

In conventional electron beam exposure apparatus, electron beams emitted from electron guns provided for exposure have been used as light sources for scanning in SEM. The SEM is used to make optical adjustments such as focusing the exposure lens and aligning the optical axis of an electron beam with the optical axis of the exposure lens before exposure, and such functions are interrupted when exposure is made by the electron beam.

FIG. 1 shows such an electron beam exposure apparatus. The apparatus consists of a control system for controlling respective units housed in a column 109 and a display 102 for checking SEM images.

The column 109 includes an electron gun 110, a condenser lens 111, a deflection coil 113 for deflecting an electron beam from the electron gun 110 so that the electron beam draws a predetermined pattern on a wafer 117 (or mask) put on a stage 116, an objective lens 114, and a secondary electron detector 115 for detecting secondary electrons generated by irradiation of the electron beam from the electron gun 110 onto the wafer 117. A pump 118 is provided to degas the column 109.

The control system includes a control computer 101, a column control 103, a vacuum control 104, a stage control 105, and an image memory 107. All instructions for the respective controls are issued by the control computer 101.

In exposure operation, the column control 103 controls the emission of electron beams from the electron gun 110 for exposure, the deflection by the deflection coil 113, and the focusing of the condenser lens 111 and the objective lens 114 so as to control the exposure operation.

The vacuum control 104 drives the pump 118 to keep the column 109 at a constant vacuum. The stage control 105 moves the stage 116 (X, Y directions and rotation) to a predetermined position at exposure and SEM recording.

In SEM operation, the column control 103 sends scanning control signals similar to those of the exposure operation to the respective units within the column for making scanning control. Also, the scanning control signal is sent to the image recording unit 107 wherein a signal indicative of a scanned image is generated from the output of the secondary electron detector 115 at respective scanning positions indicated by the scanning control signal and sent to the display 102 for showing the scanned image.

FIG. 2 shows the column control unit 103 and the image recording unit 107. It shows mainly a scanning system and omits the control of emission from the electron gun 110 and the focusing of the condenser lens 111 and the objective lens 114. As described above, the functions of the SEM are interrupted when exposure is made by the electron beam, so that the column control unit 103 for making electron beam exposure and SEM operation and the image recording unit 107 necessary for SEM operation are made independent as shown in the figure.

The image recording unit 107 includes an A/D converter 307 for converting the output of the secondary electron detector 115 to a digital signal, an image memory 304 for temporarily storing the output of the A/D converter 307, and an image conversion unit 303 for converting a predetermined amount, at a time, of image data stored in the image memory 304 to an image signal such as an RF signal or video signal.

The column control unit 103 includes a data generator 306 for receiving a control signal from the control computer 101 via a data bus 305, a D/A converter for converting the output of the data generator 306 to an analog signal, and a deflection amplifier 309 for amplifying the output of the D/A converter 308 to generate a driving signal for the deflection coil 113. An A/D converter 310 is provided to check the operation of the deflection amplifier 309 and convert the output of the deflection amplifier 309 to a digital signal and transfer it to the data bus 305. The control computer 101 checks the output of the A/D converter 310 via the data bus 305 thus the output of the deflection amplifier 309 to see if the output corresponds to the digital value set in the data generator 306, and the output level is appropriate and linear.

Such checking of the deflection amplifier 309 as described above is made at every predetermined exposure numbers or times. That is, the conventional system is made to check whether the output of the A/D converter 310 corresponds to the value set in the data generator 306. The operation check is made by changing the set value of the data generator 306, so that it takes time to check the next set value after the conversion by the A/D converter 310.

In addition, the column control unit 103 and the image recording unit 107 are made separately, so that it is necessary to provide A/D converters separately, making the system complicated.

SUMMARY OF THE INVENTION

Accordingly, it is an object of the invention to provide an electron beam exposure apparatus for scanning electron microscopy, which enables to check the deflection amplifier quickly and has a simple structure.

According to the invention there is provided an electron beam exposure apparatus for scanning electron microscopy, which includes a main control unit; an electron gun for emitting an electron beam; a deflection amplifier connected to the main control unit for outputting a drive signal for controlling deflection conditions of the electron beam; a secondary electron detector; an A/D converter selectively connected either the deflection amplifier or the secondary electron detector for generating a digital signal; an image memory connected to the A/D converter and selectively to the main control unit such that the main control checks outputs of the deflection amplifier in response to outputs of the image memory.

Since the output of the deflection amplifier is stored in the image memory so that it is possible to change the output of the deflection amplifier if the conversion time of the A/D converter laps, thereby reducing the time required to check the operation of the deflection amplifier. In addition, the image memory and the A/D converter used to check the operation of the deflection amplifier are already provided in the image recording section, thereby simplifying the apparatus.

DESCRIPTION OF THE PREFERRED EMBODIMENT

Figure 1:
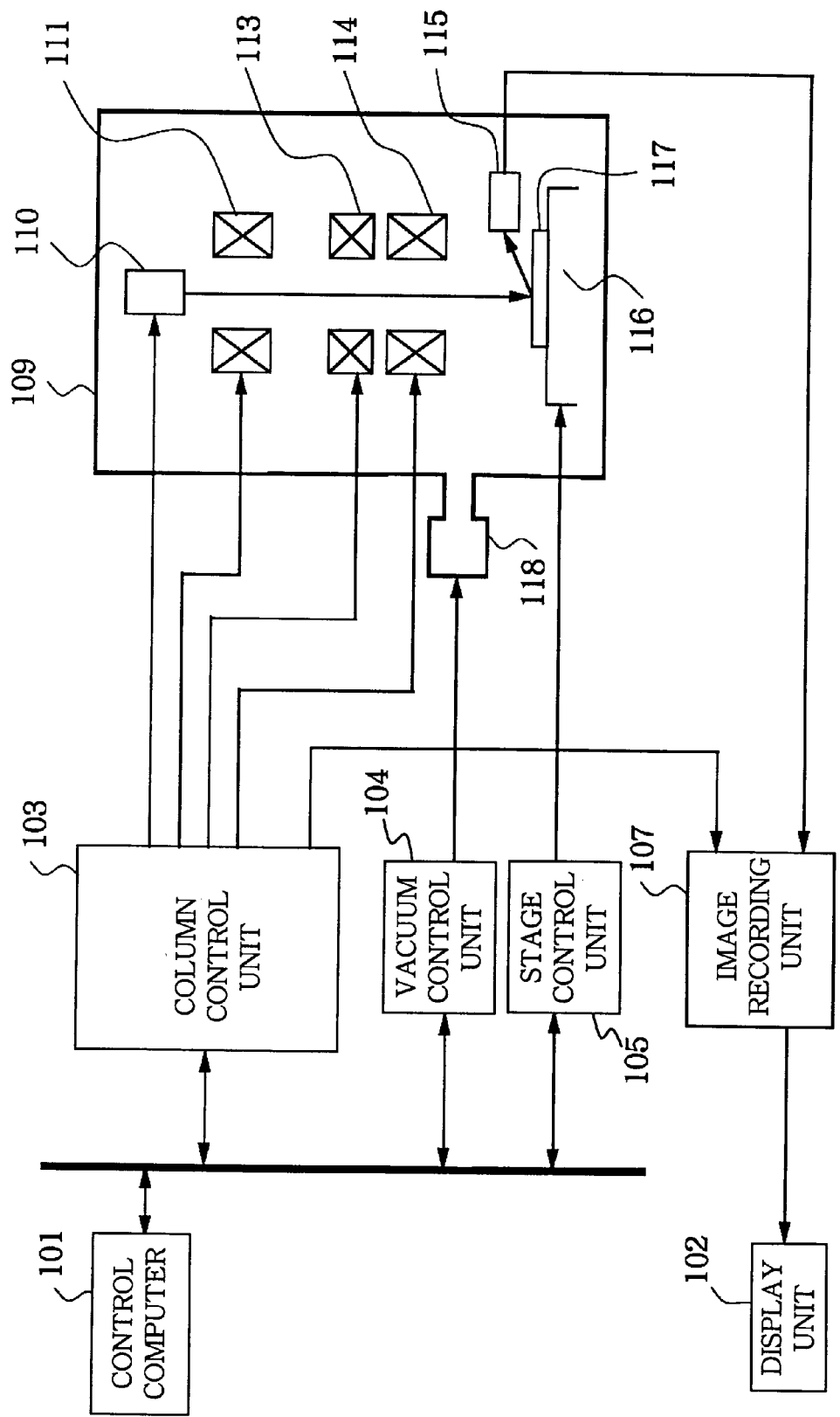
FIG. 1 is a block diagram of a conventional electron beam exposure apparatus.
Figure 3:
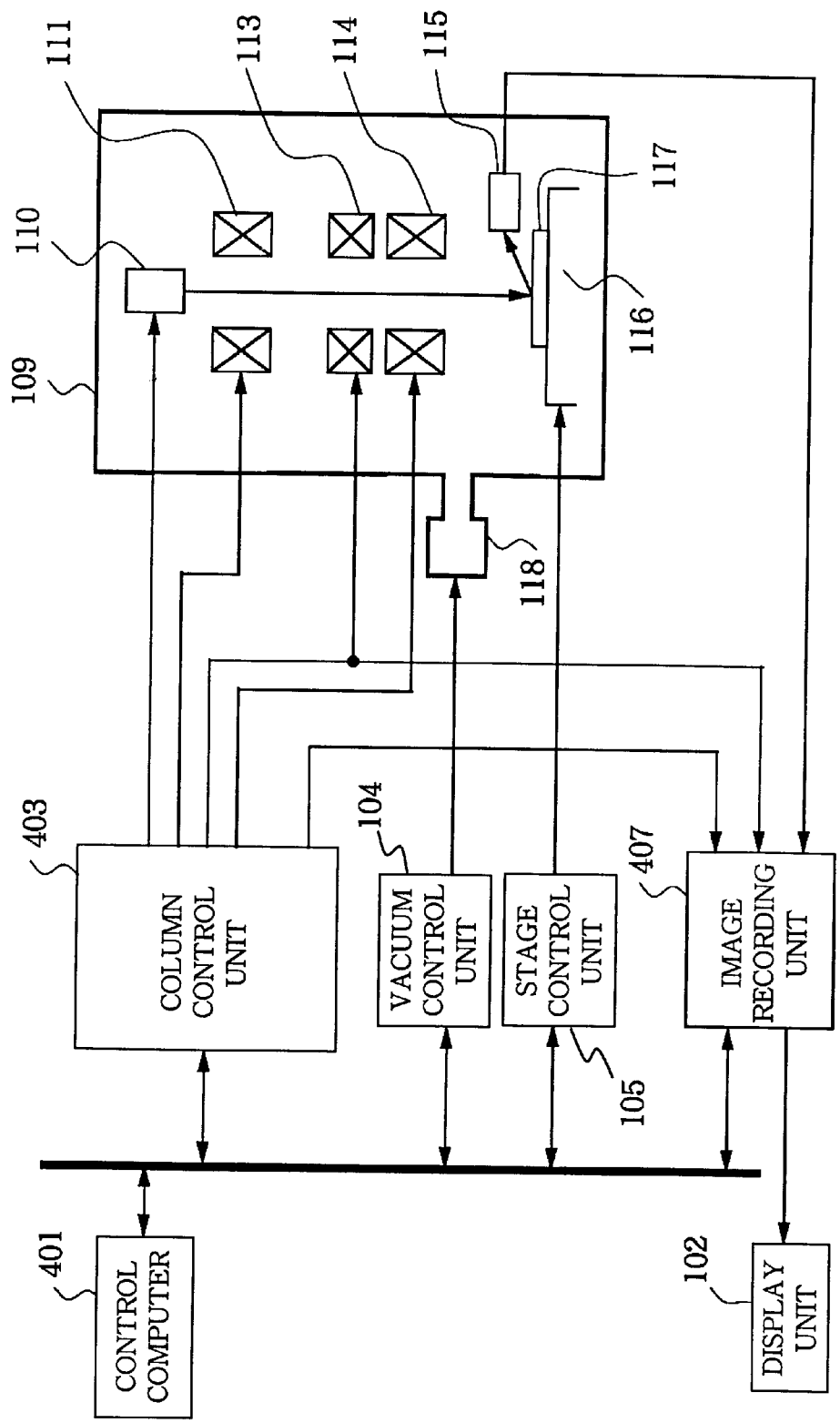
FIG. 3 is a block diagram of an electron beam exposure apparatus according to an embodiment of the invention.

In FIG. 3, the electron beam exposure apparatus includes a control computer 401 (main control unit), a column control unit 403, and an image recording unit 407 which are different from the control computer 101, the column control 103, and the image recording unit 107, respectively, of FIG. 1 and other units which are similar to those of FIG. 1 and given the same reference numbers as those of FIG. 1.

Figure 4:
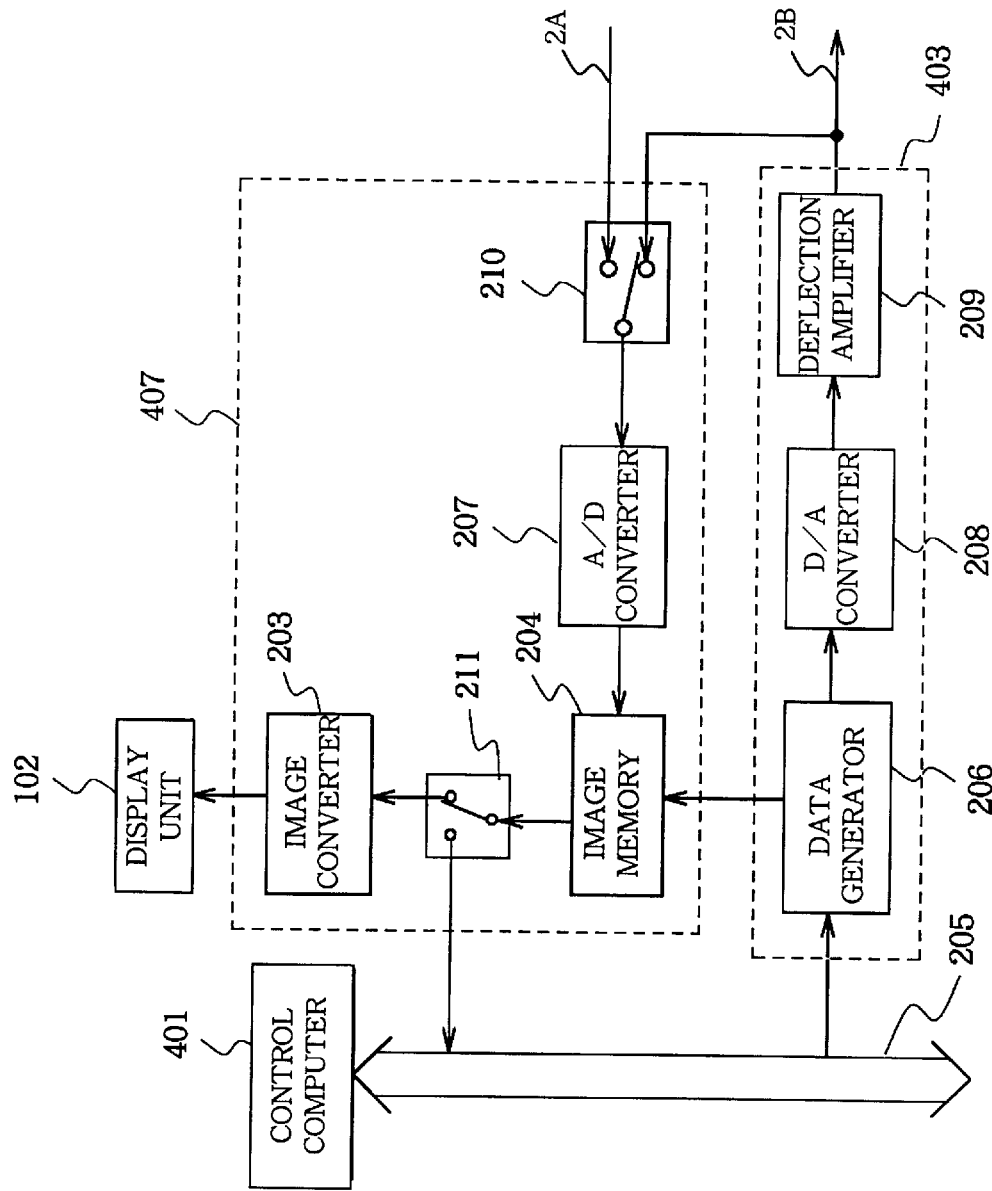
FIG. 4 is a detailed block diagram of the column control unit 403 and the image recording unit 407 of FIG. 3.

In FIG. 4, the column control unit 403 includes a column control device 403, a data generator 206, a D/A converter 208, and a deflection amplifier 209. The image recording unit 407 includes an image converter 203, an image memory 204, an A/D converter 207, and switches 210 and 211.

Figure 2:
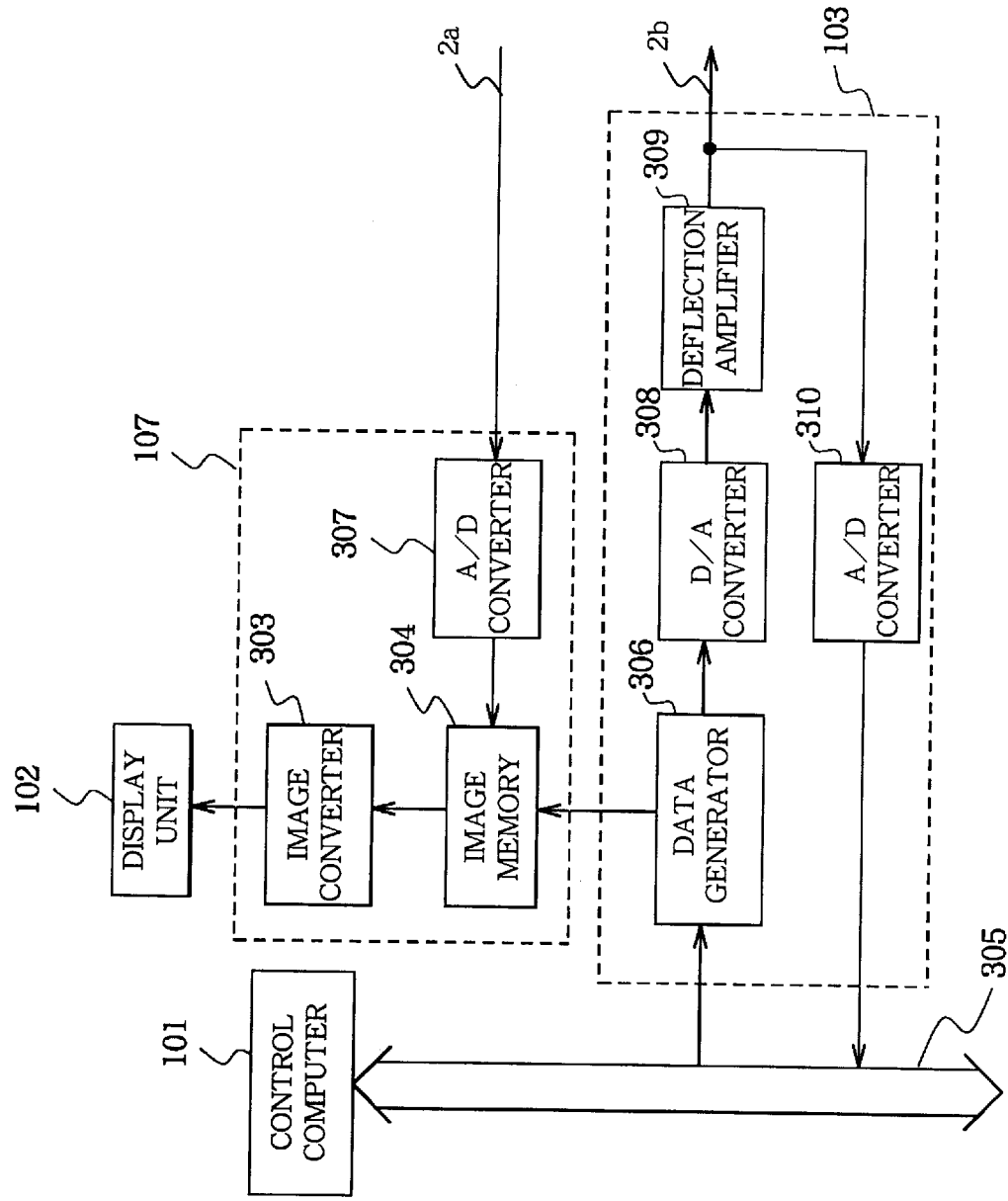
FIG. 2 is a detailed block diagram of the column control unit 103 and the image recording unit 107 of FIG. 1.

The operations of the respective devices of the column control unit 403 are similar to those of the data generator 306, the D/A converter 308, and the deflection amplifier 309 of FIG. 2, but the output of the data generator 206 is fed to the image memory of the image recording unit 403 and the output of the deflection amplifier 209 is fed to the deflection coil 113 and the change-over switch 210, with the A/D converter removed from the column control unit 103 of FIG. 2.

The change-over switch 210 in the image recording section 407 transmits either the output of the secondary electron detector 115 or the output of the deflection amplifier 209 to the A/D converter 207. The change-over switch 211 transmits the output of the image memory 204 to either the image converter 203 or the data bus 205.

The switching operations of the change-over switches 210 and 211 are controlled by control signals from the control computer 401. That is, the control computer 401 permits the change-over switch 210 to select the output of the secondary electron detector 115 and the image memory 204 to be outputted to the image converter 203 in the SEM operation. Also, it permits the change-over switch 210 to select the output of the deflection amplifier 209 and the image memory 204 to be outputted to the data bus 205 upon checking the operation of the deflection amplifier 209.

In the SEM operation, the image memory 204 temporarily stores the output of the secondary electron detector 115 which has been converted to a digital signal by the A/D converter 207 and outputs predetermined units of the stored data to the image converter 203 via the change-over switch 211. The image of the converted RF or video signal is shown in the display 102.

In checking the operation of the deflection amplifier 209, the image memory 204 receives the output of the data generator 206 and the output of the deflection amplifier 209 which is digitized by the A/D converter 207 via the change-over switch 210. The image memory 204 stores the output of the deflection amplifier 209 with the output of the data generator 206 as an address signal. The control computer 401 is connected to the image memory 204 via an address bus (not shown) and transmits as an address data to the image memory 204 the data which has been transmitted to the data generator 206 as a control signal to receive a signal indicative of the output conditions of the deflection amplifier 209 via the data bus for checking the operation.

As has been described above, the invention makes use of the image memory and A/D converter, which have been used only in the operation of the electron microscope, for checking the operation of the deflection amplifier to achieve quick check of the operation of the deflection amplifier and simplification of the apparatus.

According to the invention, the image memory is used to check the operation of the deflection amplifier without any additional hardware at a speed equal to the actual exposure or SEM operation. In the conventional apparatus, the operation of the deflection amplifier must be interrupted during the reading time of the A/D converter output by the computer, resulting in the decreased operational speed and inability to check at the actual speed. The use of the image memory according to the invention reduces the time required to check the operation.

What is claimed is:

1. An electron beam exposure apparatus for scanning electron microscopy, comprising:

a main control unit;

an electron gun for emitting an electron beam;

a deflection amplifier connected to said main control unit for outputting a drive signal for controlling deflection conditions of said electron beam;

a secondary electron detector;

an A/D converter selectively connected either said deflection amplifier or said secondary electron detector for generating a digital signal;

an image memory connected to said A/D converter and selectively to said main control unit such that said main control unit checks outputs of said deflection amplifier in response to outputs of said image memory; and a first change-over switch connected between said electron detector and said A/D convertor.

2. An electron beam exposure apparatus according to claim 1, which further comprises a second change-over switch connected between said image memory and said main control unit.

* * * * *

UNITED STATES PATENT AND TRADEMARK OFFICE
CERTIFICATE OF CORRECTION

PATENT NO. : 5,910,657  
DATED : June 8, 1999  
INVENTOR(S) : Toshiyuki Ihara

It is certified that error appears in the above-identified patent and that said Letters Patent is hereby corrected as shown below:

Title page,  
Item [73], Assignee, reads "Adavantest Corporation, Tokyo,Japan"  
should read -- Advantest Corporation, Tokyo, Japan --

Signed and Sealed this

Twenty-third Day of September, 2003

JAMES E. ROGAN  
*Director of the United States Patent and Trademark Office*